(12) United States Patent
Kondou et al.

(10) Patent No.: US 8,239,742 B2
(45) Date of Patent: Aug. 7, 2012

(54) CODING APPARATUS, CODING METHOD AND CODING PROGRAM FOR COMBING TWO DIFFERENT CODE WORDS

(75) Inventors: Keitarou Kondou, Tokyo (JP); Makoto Noda, Tokyo (JP)

(73) Assignee: Sony Corporatioin, Tokyo (JP)

( * ) Notice: Subject to any disclaimer, the term of this patent is extended or adjusted under 35 U.S.C. 154(b) by 594 days.

(21) Appl. No.: 12/470,607

(22) Filed: May 22, 2009

(65) Prior Publication Data

US 2009/0300462 A1    Dec. 3, 2009

(30) Foreign Application Priority Data

May 28, 2008    (JP) ................... P2008-139293

(51) Int. Cl.
*H03M 13/00*    (2006.01)
(52) U.S. Cl. .......................... 714/784; 341/59
(58) Field of Classification Search .................. 714/752, 714/784; 341/59
See application file for complete search history.

(56) References Cited

U.S. PATENT DOCUMENTS

| | | | |
|---|---|---|---|
| 5,717,395 A | 2/1998 | Zook | |
| 5,844,507 A | 12/1998 | Zook | |
| 6,201,485 B1 * | 3/2001 | McEwen et al. | 341/59 |
| 6,259,384 B1 * | 7/2001 | McEwen et al. | 341/59 |
| 6,417,778 B2 * | 7/2002 | Blum et al. | 340/815.4 |
| 6,567,951 B2 | 5/2003 | Senshu | |
| 6,643,814 B1 * | 11/2003 | Cideciyan et al. | 714/755 |
| 6,910,174 B2 * | 6/2005 | Keeler | 714/769 |
| 7,174,485 B2 * | 2/2007 | Silvus | 714/701 |
| 7,814,398 B2 * | 10/2010 | Djurdjevic et al. | 714/784 |
| 7,849,418 B2 * | 12/2010 | Mead | 715/784 |
| 2004/0199846 A1 | 10/2004 | Matsumoto et al. | |

FOREIGN PATENT DOCUMENTS

| | | |
|---|---|---|
| EP | 1 211 682 A3 | 12/2003 |
| WO | WO 2007/103317 A1 | 9/2007 |

OTHER PUBLICATIONS

"8 mm Wide Magnetic Tape Cartridge for Information Interchange—Helical Scan Recording—AIT-3 Format", ECMA Standardizing Information and Communication Systems, Standard ECMA-329, Dec. 2001.

"Data Interchange on 12,7 mm 384-Track Magnetic Tape Cartridges—Ultrium-1 Format", ECMA Standardizing Information and Communication Systems, Standard ECMA-319, Jun. 2001.

Combined Search and Examination Report dated Jun. 26, 2009, in GB0908296.7.

* cited by examiner

*Primary Examiner* — Esaw Abraham
(74) *Attorney, Agent, or Firm* — Finnegan Henderson Farabow Garrett & Dunner LLP

(57) ABSTRACT

Disclosed herein is an encoding apparatus which combines an RLL code word and an error correction code word, with an interleaving technique when encoding, including: an error correction encoding section; an interleaving section; and an RLL encoding section, wherein, if an address i (i is an integer satisfying relations $0 \leq i < k \times m$) is assigned to each symbol of $k \times m$ error correction code words and $x_{ij}$ is denoting the number of symbols included in n symbols of a jth (j is an integer satisfying relations $0 \leq j < m$) code word of m error correction code words to serve as symbols corresponding to the address i of an information word of an RLL code, for any j, the interleaving section interleaves a series inside an information word of the RLL code word so that the following relations are satisfied:

$$\sum_i x_{ij} = n \text{ and } x_{ij} > 0.$$

5 Claims, 14 Drawing Sheets

☐ HIGH-ORDER BYTE OF THE RLL CODE INFORMATION WORD

▨ LOW-ORDER BYTE OF THE RLL CODE INFORMATION WORD

FIG.3

| INPUT | CODE WORD |
|---|---|
| 0000000000000000 | 00000100000010001 |
| 0000000000000001 | 00000100000010010 |
| 0000000000000010 | 00000100000010011 |
| 0000000000000011 | 00000100000010100 |
| 0000000000000100 | 00000100000010101 |
| 0000000000000101 | 00000100000010110 |
| 0000000000000110 | 00000100000011010 |
| 0000000000000111 | 00000100000011011 |
| 0000000000001000 | 00000100000011100 |
| 0000000000001001 | 00000100000011101 |

FIG.9

|   |   |   |   |
|---|---|---|---|
| 0 | 1 | 2 | 3 |
| 1 | 0 | 3 | 2 |
| 0 | 1 | 2 | 3 |
| 1 | 0 | 3 | 2 |
| 0 | 1 | 2 | 3 |
| 1 | 0 | 3 | 2 |
| 0 | 1 | 2 | 3 |
| 1 | 0 | 3 | 2 |
| 0 | 1 | 2 | 3 |
| 1 | 0 | 3 | 2 |
| 0 | 1 | 2 | 3 |
| 1 | 0 | 3 | 2 |

|   | L=4 |   |   |
|---|---|---|---|
|   | m=4 |   |   |
| 0 | 1 | 2 | 3 |
| 3 | 0 | 1 | 2 |
| 2 | 3 | 0 | 1 |
| 1 | 2 | 3 | 0 |
| 0 | 1 | 2 | 3 |
| 3 | 0 | 1 | 2 |
| 2 | 3 | 0 | 1 |
| 1 | 2 | 3 | 0 |
| 0 | 1 | 2 | 3 |
| 3 | 0 | 1 | 2 |
| 2 | 3 | 0 | 1 |
| 1 | 2 | 3 | 0 |
| 0 | 1 | 2 | 3 |
| 3 | 0 | 1 | 2 |
| 2 | 3 | 0 | 1 |
| 1 | 2 | 3 | 0 |

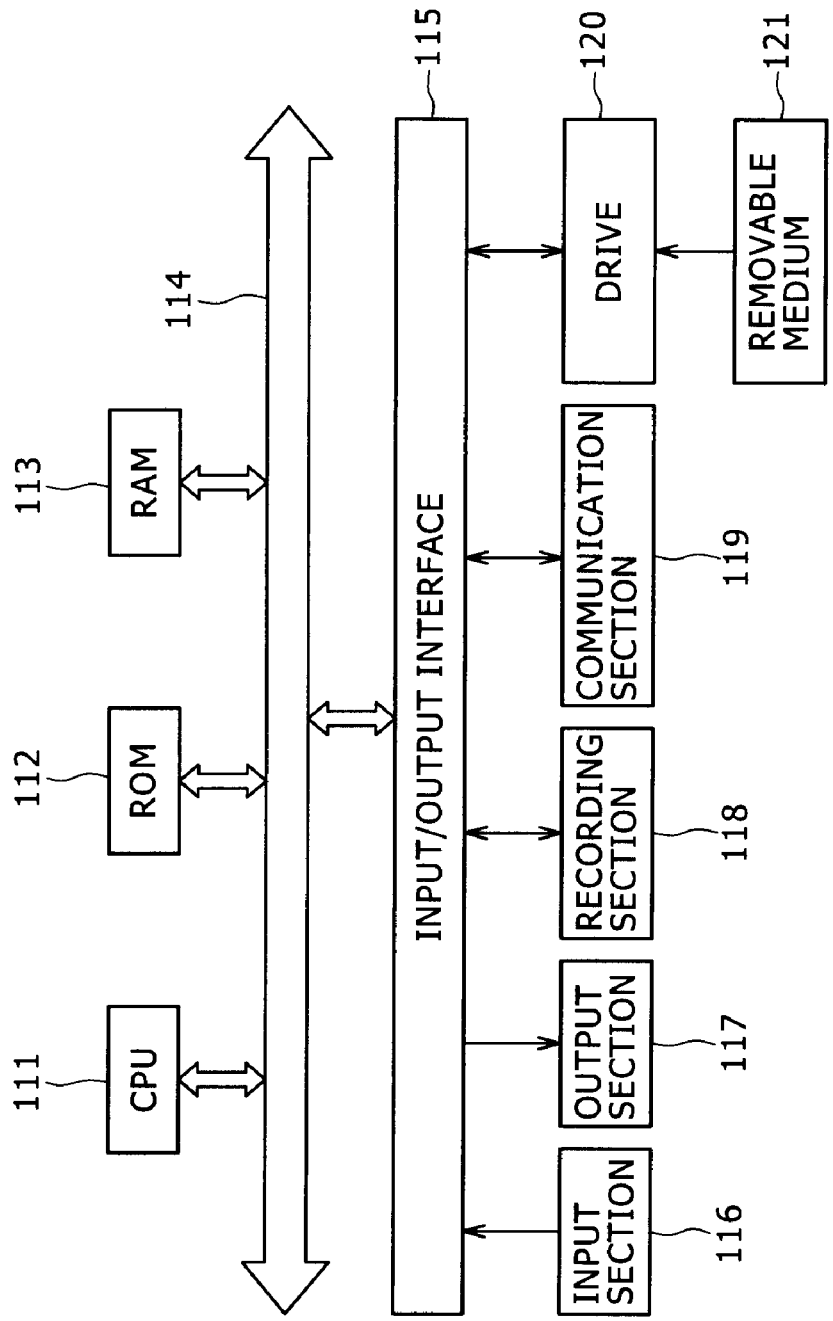

CODING APPARATUS, CODING METHOD AND CODING PROGRAM FOR COMBING TWO DIFFERENT CODE WORDS

BACKGROUND OF THE INVENTION

1. Field of the Invention

In general, the present invention relates to a coding apparatus, a coding method adopted by the coding apparatus and a coding program implementing the coding method. In particular, the present invention relates to a coding apparatus capable of reducing a bit error rate, a coding method adopted by the coding apparatus and a coding program implementing the coding method.

2. Description of the Related Art

In recent years, in an operation to encode digital data by making use of error correction codes or encode digital data in accordance with RLL (Run Length Limited) codes and store the result of the coding operation in an apparatus such as a magnetic-tape recording apparatus or an optical-disc apparatus, an interleaving technology for coding the digital data by combining the error correction codes with an interleaving technique is adopted in order to allow errors to be corrected with a high degree of efficiency. Also before digital data is transmitted in a multi-input multi-output transmission system, the digital data is encoded by adoption of the interleaving technology for coding the digital data by combining error correction codes with the interleaving technique.

The RLL code is a code for encoding input data so that the maximum number of consecutive 0 bits or 1 bits to be stored in a recording apparatus or transmitted in a transmission system is limited to a finite number. The RLL code is used widely in fields such as a high-density magnetic recording field and a high-speed transmission field. For example, an 8b10b code limits the maximum number of consecutive 0 bits or 1 bits to an integer not greater than 5. The 8b10b code is widely used in high-speed transmission systems such as a PCI (Peripheral Component Interconnect) Express transmission system and a gigabit Ethernet transmission system. In addition, a TMDS (Transition Minimized Differential Signaling) used in a digital-video transmission system at an HDMI (High Definition Multimedia Interface) is used for such a purpose.

On the other hand, the error correction code is a code for encoding input data so that errors contained in the encoded data can be corrected. Errors contained in the encoded data are errors generated in operations to store the data into a recording medium, reproduce the data from a recording medium and transmit the data in a transmission system.

Technologies relevant to the RLL code and the error correction code are described in documents such as U.S. Pat. No. 5,717,395 entitled "Rate 16/17 ENDEC with independent high/low byte decoding" and U.S. Pat. No. 6,567,951 entitled "Optical disc format exhibiting robust error correction coding," hereinafter each referred to as Patent Documents 1 and 2, as well as "8 mm Wide Magnetic Tape Cartridge for Information Interchange Helical Scan Recording=AIT-3 Format," Standard ECMA-329, December 2001. and "12.7 mm-384-Track Magnetic Tape Cartridges—Ultrium-1 Format," Standard ECMA-319, June 2001, hereinafter each referred to as Non-Patent Documents 1 and 2.

SUMMARY OF THE INVENTION

Non-Patent Document 1 discloses a configuration combining the RLL code with an RS (Reed-Solomon) product code which is composed of three different RS codes, i.e., C1, C2 and C3 codes. The C2 RS code is an RS (56, 48) code having a code length of 56 symbols and an information word length of 48 symbols which each occupy 1 byte. The RLL code is a code which has a code length of 18 bits and an information word length of 16 bits.

In some cases, the error correction code is used by combining the code with an interleaving technique in order to allow burst errors generated consecutively along a transmission line to be corrected. In general, error correction codes each having a code length of N symbols and an information word length of K symbols are combined with an L-stage interleaving technique as shown in a diagram of FIG. 1.

In the diagram of FIG. 1, each square block represents a symbol whereas each column represents one error correction code. The L-stage interleaving technique is adopted to rearrange L error correction codes and transmit or store the L rearranged codes in an order indicated by dashed-line arrows. Each of hatched square blocks included in every error correction code is a parity symbol. Thus, an error correction code with a length of N symbols is composed of K information word symbols and (N−K) parity symbols.

In accordance with Non-Patent Document 1, C2 RS codes are combined with a 228-stage interleaving technique. Let us think of an RLL encoding operation carried out after an interleaving process in a transmission order. FIG. 2 is a diagram showing high-order bytes each included in the RLL code word as a byte composed of 8 high-order bits and low-order bytes each included in the RLL code word as a byte composed of 8 low-order bits. The bytes shown in the diagram of FIG. 2 are a result of the interleaving process.

That is to say, as is obvious from the diagram of FIG. 2, a C2 code word has two different types. One of the types is a code word composed of only high-order bytes of an RLL code word whereas the other type is a code word composed of only low-order bytes of an RLL code word. Each of the high-order bytes is composed of 8 high-order bits and is shown as a white square block whereas each of the low-order bytes is composed of 8 low-order bits and is shown as a dark square block.

If an information word in the RLL code is data of m bits, input data supplied to an encoder is encoded in a coding process carried out by the encoder into a code word of n bits. There are $2^m$ different types of input data supplied to the encoder and $2^n$ different output patterns. The coding process is carried out by associating input data with a specific one of the output patterns. The specific output pattern with which the input data is associated satisfies a characteristic for the state of the encoder. In addition, bits of a code word may include an error caused by propagation of the code word prior to a decoding process. In this case, in accordance with a coding law of the RLL code, an m-bit information word obtained as a result of the decoding process may have different bit error rates for the high-order bits and the low-order bits. The difference in bit error rate between the high-order bits and the low-order bits raises a problem if pieces of output data included in a code conversion table are arranged in a dictionary order.

As RLL codes raising this problem, code words generated from sequentially supplied pieces of input data having values in the range 0 to 9 are shown in a table of FIG. 3. On the left-hand side of the table of FIG. 3, the pieces of input data having values in the range 0 to 9 are arranged in an order of increasing values. On the other hand, code words corresponding to the pieces of input data are arranged on the right-hand side of the table of FIG. 3.

For example, if the first and second low-order bits of the code word corresponding to the input data having a value of 1 are both erroneous as shown in the table of FIG. 3, a result of a decoding process has a value of 2 which is different from the value of the input data. In this case, errors are generated in the first and second bits of the result of the decoding process but not in bits of the orders higher than the first and second bits.

FIG. 4 is a diagram showing graphs each representing bit error rates in high-order and low-order bytes of a 16-bit information word obtained as a result of an RLL decoding process carried out by a decoder receiving inputs with a varying bit error rate. As described earlier, the high-order byte is composed of 8 high-order bits whereas the low-order byte is composed of 8 low-order bits. The inputs supplied to the decoder are data obtained as a result of an encoding process carried out on 17-bit code word including an information word having a length of 16 bits as a typical example of such an RLL code.

In the diagram of FIG. 4, the horizontal-direction axis represents the bit error rate of the input supplied to the decoder. The direction from the left-hand side to the right-hand side along the horizontal-direction axis is a direction in which the bit error rate of the input supplied to the decoder worsens. On the other hand, the vertical-direction axis in the diagram of FIG. 4 represents the bit error rate of the output generated by the decoder. The direction from the lower side to the upper side along the vertical-direction axis is a direction in which the bit error rate of the output generated by the decoder worsens. The graph shown as a line connecting rhombic points in the diagram of FIG. 4 is a graph showing bit error rates for the RLL code word. The graph shown as a line connecting rectangular points in the diagram of FIG. 4 is a graph showing bit error rates for the high-order byte. The graph shown as a line connecting triangular points in the diagram of FIG. 4 is a graph showing bit error rates for the low-order byte.

As described above, there is a difference in bit error rate between the high-order and low-order bytes of an information word obtained as a result of a decoding process. Thus, if the interleaving technique described above is adopted, in the RS code serving as an error correction code, a code word including only symbols each having a high bit error rate coexists with a code word including only symbols each having a low bit error rate. Thus, as shown in the diagram of FIG. 4, in comparison with in a code word including only symbols each having a low bit error rate, in a code word including only symbols each having a high bit error rate, the frequency to generate a code having a power exceeding the power of an error correction code increases and the actual post-decoding bit error rate of the output generated by the decoder is higher than the post-decoding bit error rate which is inferred from a pre-decoding byte error.

In addition, a magnetic-tape recording system disclosed in Non-Patent Document 2 adopts an error correction format created by combining the C1 error correction code with a two-stage interleaving technique. In the format disclosed by this reference, an RLL encoding process carried out in symbol units is not implemented. Nevertheless, the magnetic-tape recording system disclosed in Non-Patent Document 2 raises the same problem in the case of a configuration which combines the interleaving technique with the 16/17 RLL code having the characteristics like the ones shown in the diagram of FIG. 4.

In addition, Patent Document 1 discloses a typical interleaving technique to interleave 16/17 RLL codes with RS codes.

This typical interleaving technique has three stages and the information word of the RLL code has two symbols represented by a high-order byte and a low-order byte respectively. Thus, the high-order byte and the low-order byte are originated from their respective RS code words and the number of high-order bytes in their RS code word is equal to the number of low-order bytes in their RS code word. In this case, the problem explained in the description of a typical example disclosed in Non-Patent Document 1 is not raised. If the number of interleaving stages in the same configuration is even, however, there are two different RS code words as is the case with the configuration disclosed in Non-Patent Document 1. One of the RS code words is an RS code word composed of only high-order bytes whereas the other RS code word is an RS code word composed of only high-order bytes.

Patent Document 2 discloses an error correction coding technique provided for optical discs. Also in the case of this error correction coding technique, if the number of interleaving stages is divisible by the length of the RLL information word, the C1 code word in the error correction coding technique disclosed in this reference raises the same problem.

Addressing the problems described above, inventors of the present invention have innovated an encoding apparatus capable of reducing a bit error rate.

In accordance with a first embodiment of the present invention, there is provided an encoding apparatus for carrying out an encoding process by combining two different code words, i.e., an RLL (Run Length Limited) code word and an error correction code word, with an interleaving technique. The encoding apparatus according to the embodiment of the present invention employs:

error correction encoding means for encoding input data into the error correction code word;

interleaving means for interleaving (k×m) aforementioned error correction code words each having a length of n symbols in the case of the RLL code word composed of an information word with a length of m symbols where a symbol is a unit composing the error correction code word, notation m denotes an integer equal to or greater than 2 (that is, m≧2) and notation k denotes an integer equal to or greater than 1 (that is, k≧1); and RLL encoding means for encoding an information word of an RLL code word, which is generated by the interleaving means, into the RLL code word.

In the encoding apparatus, if an address i (where notation is an integer satisfying relations 0≦i<k×m) is assigned to each symbol of the k×m error correction code words and $x_{ij}$ is taken as a notation denoting the number of symbols included in n symbols of a jth (where notation j is an integer satisfying relations 0≦j<m) code word of m error correction code words to serve as symbols corresponding to the address i of an information word of an RLL code, for any j, the interleaving means interleaves a series inside an information word of the RLL code word so that the following relations are satisfied:

$$\sum_i x_{ij} = n \text{ and } x_{ij} > 0;$$

and if the code word length n is a multiple of the information word length m and ε is taken as a notation representing the ratio of n to m (that is, ε=n/m), the interleaving means interleaves the series so that the following relations are satisfied:

$$\sum_i x_{ij} = n \text{ and } x_{ij} = \varepsilon.$$

In accordance with a second embodiment of the present invention, there is provided an encoding method for an encoding apparatus for carrying out an encoding process by combining two different code words, i.e., an RLL code word and an error correction code word, with an interleaving technique. The encoding method according to the second embodiment of the present invention has the steps of:

encoding input data into the error correction code word;

interleaving (k×m) aforementioned error correction code words each having a length of n symbols in the case of the RLL code word composed of an information word with a length of m symbols where a symbol is a unit composing the error correction code word, notation m denotes an integer equal to or greater than 2 (that is, m≧2) and notation k denotes an integer equal to or greater than 1 (that is, k≧1); and encoding an information word of an RLL code word, which is generated at the interleaving step, into the RLL code word, whereby, if an address i (where notation i is an integer satisfying relations 0≦i<k×m) is assigned to each symbol of the k×m error correction code words and $x_{ij}$ is taken as a notation denoting the number of symbols included in n symbols of a jth (where notation j is an integer satisfying relations 0≦j<m) code word of m error correction code words to serve as symbols corresponding to the address i of an information word of an RLL code, for any j, a series inside an information word of the RLL code word is interleaved so that the following relations are satisfied:

$$\sum_i x_{ij} = n \text{ and } x_{ij} > 0.$$

A coding program according to a third embodiment of the present invention is a program implementing the coding method described above as the coding method according to the second embodiment of the present invention.

In the coding apparatus according to the first embodiment of the present invention, the coding method according to the second embodiment of the present invention and the coding program according to the third embodiment of the present invention, input data is encoded into an error correction code word. Then, (k×m) aforementioned error correction code words each having a length of n symbols are interleaved in the case of the RLL code word composed of an information word with a length of m symbols where a symbol is a unit composing the error correction code word, notation m denotes an integer equal to or greater than 2 (that is, m≧2) and notation k denotes an integer equal to or greater than 1 (that is, k≧1). Finally, an information word of an RLL code word, which is generated as a result of the interleaving process, is encoded into the RLL code word. At that time, if an address i (where notation i is an integer satisfying relations 0≦i<k×m) is assigned to each symbol of the k×m error correction code words and $x_{ij}$ is taken as a notation denoting the number of symbols included in n symbols of a jth (where notation j is an integer satisfying relations 0≦j<m) code word of m error correction code words to serve as symbols corresponding to the address i of an information word of an RLL code, for any j, a series inside an information word of the RLL code word is interleaved so that the following relations are satisfied:

$$\sum_i x_{ij} = n \text{ and } x_{ij} > 0.$$

As described above, in accordance with the embodiments of the present invention, the bit error rates can be decreased.

BRIEF DESCRIPTION OF THE DRAWINGS

These and other innovations as well features of the present invention will become clear from the following description of the preferred embodiments given with reference to the accompanying diagrams, in which:

FIG. 3 is a table showing inputs and outputs that are RLL code words generated as a result of an encoding process from the inputs;

FIG. 9 is a diagram showing error correction code words stored in a buffer memory as a typical actual result of an interleaving process;

FIG. 12 is a diagram showing error correction code words stored in a buffer memory as another typical actual result of an interleaving process;

FIG. 13 is a diagram showing error correction code words stored in a buffer memory as a further typical actual result of an interleaving process;

FIG. 17 is a block diagram showing the configuration of a general-purpose personal computer for executing programs in its capacity as a recording/reproduction apparatus in order to carry out a series of processes represented by the flowchart shown in FIG. 15.

DETAILED DESCRIPTION OF THE PREFERRED EMBODIMENT

A preferred embodiment of the present invention is explained by referring to diagrams as follows.

Figure 5:
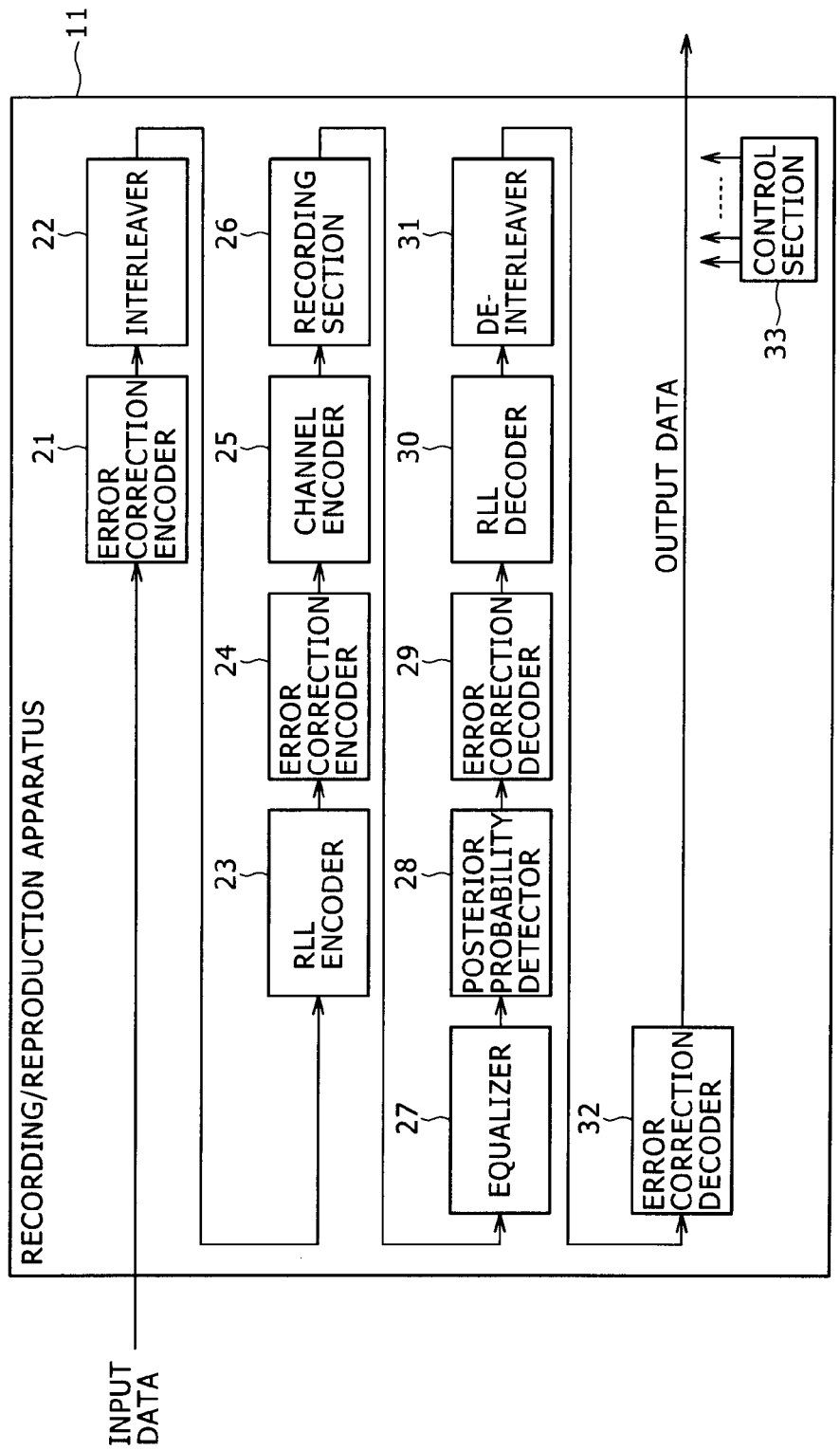
FIG. 5 is a block diagram showing the configuration of a recording/reproduction apparatus according to an embodiment of the present invention.

FIG. 5 is a block diagram showing the configuration of a recording/reproduction apparatus 11 according to an embodiment of the present invention.

As shown in the diagram of FIG. 5, the recording/reproduction apparatus 11 employs an error correction encoder 21, an interleaver 22, an RLL encoder 23, an error correction encoder 24, a channel encoder 25, a recording section 26, an equalizer 27, a posterior probability detector 28, an error correction decoder 29, an RLL decoder 30, a de-interleaver 31 and an error correction decoder 32. In addition, the recording/reproduction apparatus 11 also has a control section 33 for controlling the other sections employed in the recording/reproduction apparatus 11.

Input data received by the recording/reproduction apparatus 11 is supplied to the error correction encoder 21. The error correction encoder 21 is a section for encoding the input data having a length of $C_k^1$ symbols into a code word having a length of $C_n^1$ symbols. In the following description, the code word having a length of $C_n^1$ symbols is referred to as an error correction code word 1. The error correction code word 1 obtained as a result of the encoding process carried out by the error correction encoder 21 is supplied to the interleaver 22.

The interleaver 22 is a section for carrying out an interleaving process to interleave error correction code words 1 received from the error correction encoder 21. The number of error correction code words 1 to be interleaved by the interleaver 22 is determined in advance. A result of the interleaving process carried out by the interleaver 22 is supplied to an RLL encoder 23 in units which each are composed of $r_k$ bits. It is to be noted that the interleaver 22 carries out the interleaving process for reducing the bit error rate in accordance with control executed by the control section 33. Details of the interleaving process will be described later.

The RLL encoder 23 is a section for carrying out an RLL encoding process to encode an input received from the interleaver 22 as an input having a length of $r_k$ bits into an RLL code word which has a length of $r_n$ bits. The RLL encoder 23 supplies a result of the encoding process to the error correction encoder 24 in units which are each an RLL code word having a length of $r_n$ bits.

The error correction encoder 24 receives the RLL code word, which is output by the RLL encoder 23, as an input. The error correction encoder 24 carries out an error correction encoding process to encode this input having a length of $c_k^2$ bits into a code word having a length of $c_n^2$ bits. The code word having a length of $c_n^2$ bits is referred to hereafter as an error correction code word 2. The error correction code word 2 obtained as a result of the encoding process carried out by the error correction encoder 24 is supplied to the channel encoder 25.

The channel encoder 25 is a section for carrying out a channel encoding process to encode the error correction code word 2 received from the error correction encoder 24 and storing the result of the process onto the recording section 26. In this way, the input data supplied to the error correction encoder 21 is finally stored in the recording section 26.

In an operation to reproduce data stored in the recording section 26 from the recording section 26, on the other hand, the reproduction waveform of data read out from the recording section 26 is supplied to an analog equalizer and an A/D (analog to digital) converter, which are not shown in the block diagram of FIG. 5, in order to generate a received value for each unit time. The received value is then supplied to the equalizer 27.

The equalizer 27 is a section for carrying out a waveform equalization process on the received value supplied by the A/D converter and supplying the equalized value obtained as a result of the waveform equalization process for each unit time to the posterior probability detector 28.

The posterior probability detector 28 is a section for sequentially computing a posterior probability for every unit time from equalized values each received from the equalizer 27 for every unit time as an equalized value resulting from the waveform equalization process carried out by the equalizer 27 on a received value. The posterior probability detector 28 supplies the computed posterior probability to the error correction decoder 29.

The error correction decoder 29 receives the computed posterior probabilities for $c_n^2$ unit times from the posterior probability detector 28. The error correction decoder 29 carries out a decoding process to decode the error correction code word 2 by making use of the computed posterior probabilities and supplies $c_k^2$ bits obtained as a result of the decoding process to the RLL decoder 30 for every unit which is composed of $r_n$ bits.

The RLL decoder 30 is a section for carrying out a decoding process to decode an RLL code word received from the error correction decoder 29 and outputting the result of the decoding process to the de-interleaver 31 for every unit which is composed of $r_k$ bits.

The de-interleaver 31 is a section for carrying out a de-interleaving process determined in advance on the output generated by the RLL decoder 30 and outputting the result of the process to the error correction decoder 32. The de-interleaving process is a process opposite to the interleaving process carried out by the interleaver 22 described above. That is to say, the de-interleaver 31 is a section forming a pair in conjunction with the interleaver 22 for carrying out the interleaving process.

The error correction decoder 32 is a section for carrying out a decoding process to decode the error correction code word 1 received from the de-interleaver 31 as a word having a length of $C_n^1$ symbols into output data having a length of $C_k^1$ symbols. The error correction decoder 32 outputs this output data obtained as a result of the decoding process.

It is to be noted that, in the recording/reproduction apparatus 11 shown in the block diagram of FIG. 5, the error correction encoder 24 is provided to serve as a section for correcting a random error. Thus, the error correction encoder 24 is not a section absolutely required for the recording/reproduction apparatus 11. That is to say, it is also possible to provide the recording/reproduction apparatus 11 with a configuration in which the output generated by the RLL encoder 23 is supplied directly to the channel encoder 25. In the case of such a configuration, it is not necessary to provide the posterior probability detector 28 and the error correction decoder 29 at later stages of the configuration as sections for carrying out processes corresponding to the process carried out by the error correction encoder 24.

As described above, the recording/reproduction apparatus 11 carries out the encoding processing in the error correction encoder 21 to the recording section 26 and the decoding processing in the equalizer 27 to the error correction decoder 32.

Figure 6:
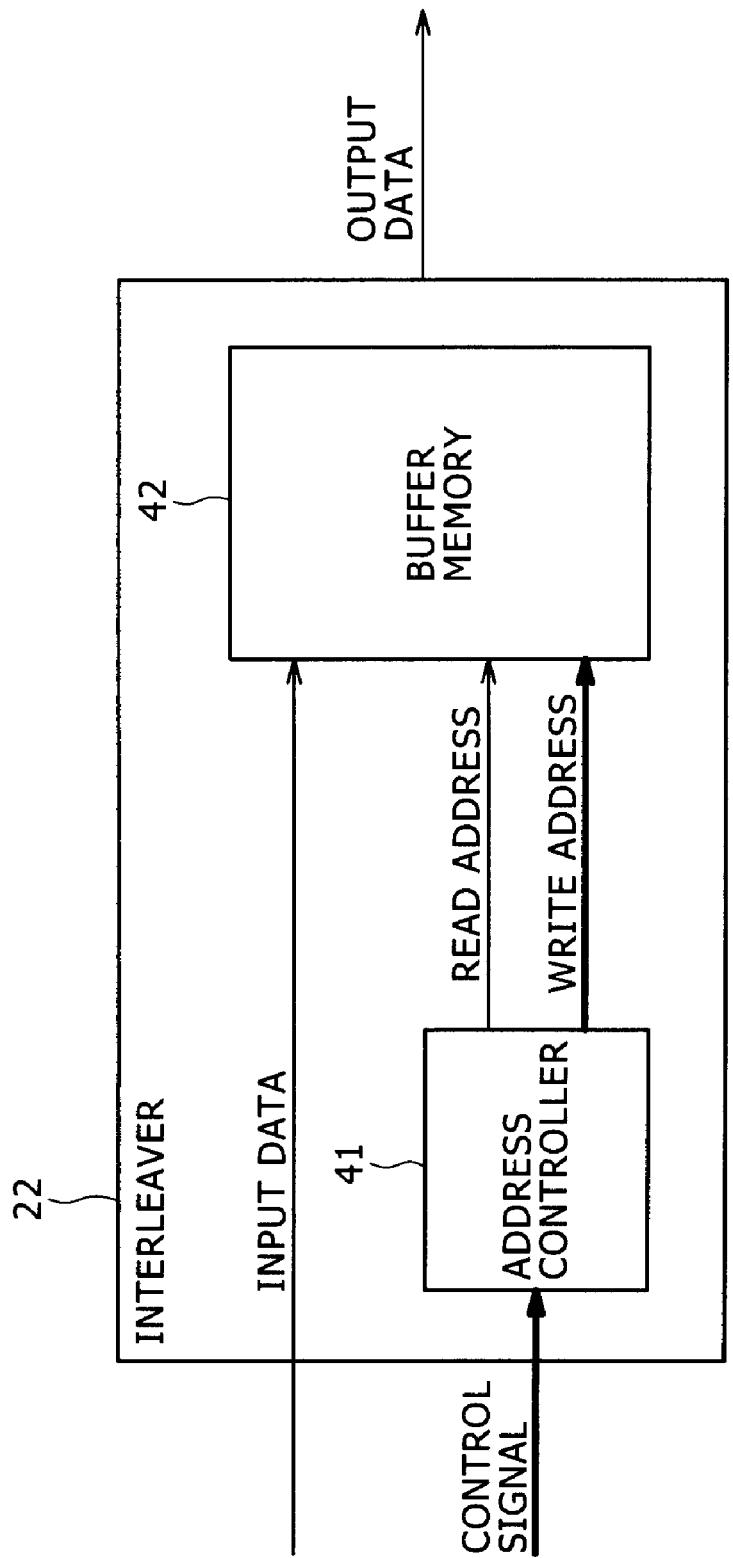
FIG. 6 is a block diagram showing a detailed configuration of an interleaver employed in the recording/reproduction apparatus.

Next, the detailed configuration of the interleaver 22 employed in the recording/reproduction apparatus 11 shown in the block diagram of FIG. 5 is explained by referring to a block diagram of FIG. 6.

The interleaver 22 is an L-stage interleaver for interleaving error correction code words each having a length of $C_n^1$ symbols. As shown in the block diagram of FIG. 6, the interleaver 22 employs an address controller 41 and a buffer memory 42.

The address controller 41 is a section for controlling read and write addresses for the buffer memory 42 in accordance with a control signal received from the control section 33. By controlling read and write addresses for the buffer memory 42, the interleaver 22 is capable of rearranging error correction code words supplied by the error correction encoder 21 to the buffer memory 42.

It is to be noted that, for example, the control signal is generated by the control section 33 on the basis of typically sync (synchronization) patterns detected from the sections employed in the recording/reproduction apparatus 11. In the case of the interleaver 22, when the control section 33 detects a predetermined timing to change the read address, the control section 33 supplies a control signal to the address controller 41. If an encoding process is carried out normally for example, the control section 33 supplies a control signal to the address controller 41 when the encoding process is ended or when data at L stages has been stored in the buffer memory 42.

Thus, the address controller 41 is capable of changing a read/write address in accordance with a control signal generated by the control section 33. As a result, pieces of data supplied to the buffer memory 42 can be rearranged with a high degree of freedom.

Figure 7:
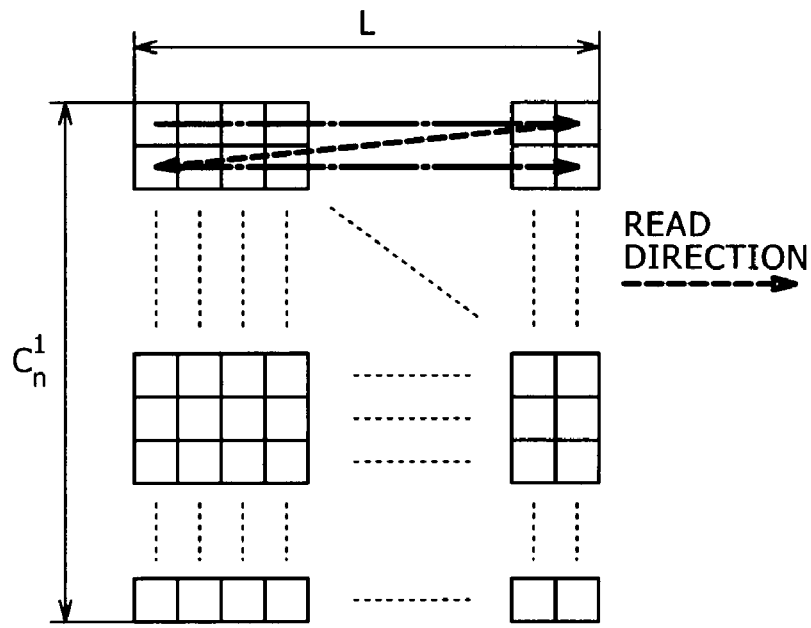
FIG. 7 is a diagram showing locations of error correction code words in a buffer memory.

As shown in a diagram of FIG. 7, the buffer memory 42 is a memory used for storing data composed of $C_n^1 \times L$ symbols. The address controller 41 changes the read/write address of a storage location in the buffer memory 42 in order to change the order in which pieces of data are to be input to the buffer memory 42, that is, in order to apparently rearrange the pieces of data. The pieces of data stored in the buffer memory 42 are supplied to the RLL encoder 23 as output data, as needed.

In accordance with an interleaving technique according to this embodiment, on the other hand, pieces of data are read out from the read addresses in fixed directions each indicated by a dashed-line arrow as shown in a diagram of FIG. 7, and only write addresses are changed. In addition, in the embodiment, it is assumed that one symbol has a length of 8 bits, $r_k=16$ and $r_n=17$. In addition, it is also assumed that $C_n^1$ and L are even, respectively. In this case, an RLL information word is composed of a high-order byte composed of 8 high-order bits and a low-order byte composed of 8 low-order bits. The interleaver 22 carries out an interleaving process so that the number of high-order byte of an RLL information word included in error correction code words 1 is equal to the number of low-order byte of the RLL information word included in the error correction code words 1. In addition, the output data generated by the interleaver 22 as RLL information words is subjected to an RLL encoding process carried out by the RLL encoder 23 sequentially in an order starting with the head of the output data in order to produce information words of RLL codes.

As shown in the diagram of FIG. 7, data stored in the buffer memory 42 employed in the interleaver 22 is L pieces of data or L error correction code words 1 which each have a length of $C_n^1$ symbols. In addition, the address controller 41 assigns each labels of 0 to $(C_n^1-1)$ to a horizontal array of L pieces of data obtained as a result of the interleaving process where notation L denotes the number of stages of the interleaving process.

In the embodiment, the following interleaving process is proposed as described below by considering distribution of errors in information words obtained as a result of a decoding process carried out on RLL codes.

Interleaving-subject data is stored in the buffer memory 42 in the form of a matrix as shown in the diagram of FIG. 7. Let notation i denote the number of a column of the matrix whereas notation j denote the number of a row of the matrix. In addition, let notation $S_{ij}$ represent the position of a symbol in the matrix whereas notation $W_i$ denote an error correction code word 1 at one of the L interleaving stages where $0 \leq i < L$. The address controller 41 changes the write addresses so that the positions of symbols of the code words in the buffer memory 42 satisfy equations referred to as Eq. (1) given as follows.

$$W_{2k} = \{S_{0,2k}, S_{1,2k+1}, S_{2,2k}, \ldots, S_{i,2k+(i \bmod 2)}, \ldots, S_{C_n^1-1, 2k+1}\},$$

$$W_{2k+1} = \{S_{0,2k+1}, S_{1,2k}, S_{2,2k+1}, \ldots, S_{i,2k+((i+1) \bmod 2)}, \ldots, S_{C_n^1-1, 2k}\} \quad (1)$$

In Eq. (1), subscript k has a value in the range $0 \leq k < L/2$.

Figure 8:
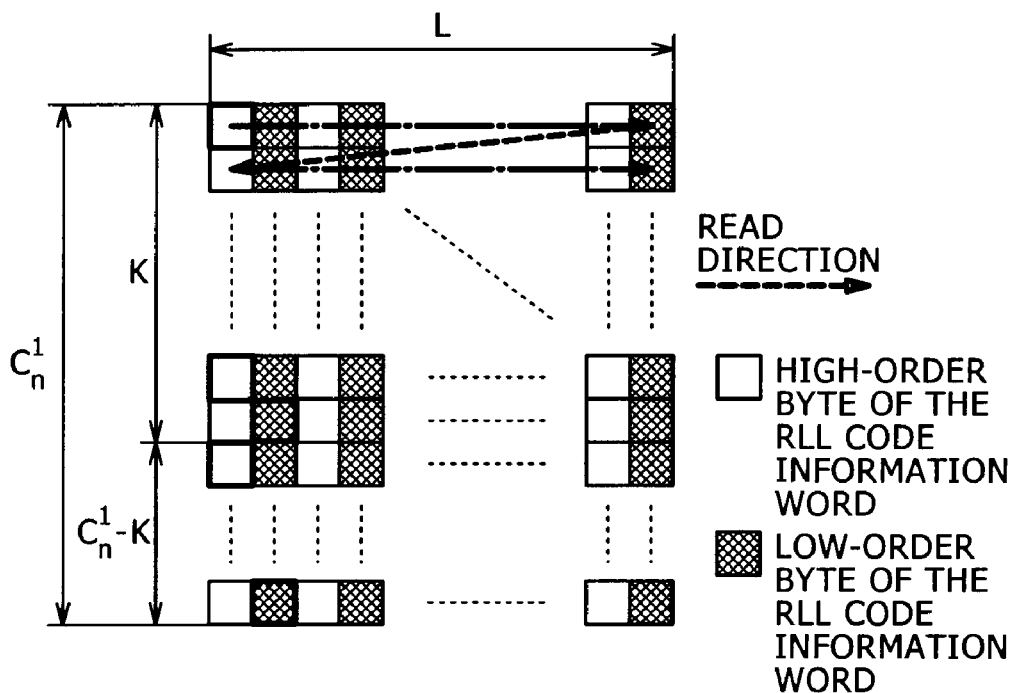
FIG. 8 is a diagram showing locations of high-order and low-order bytes of RLL code words in a buffer memory.

FIG. 8 is a diagram showing symbols of an error correction code word $W_0$. The symbols of the error correction code word $W_0$ are shown among symbols of the error correction code words $W_i$ which are stored in the buffer memory 42 in accordance with the interleaving method.

In the diagram of FIG. 8, a square block represents a symbol (or a byte) of an RLL code word. To be more specific, a white square block represents the high-order byte of an RLL code word whereas a hatched square block represents the low-order byte of an RLL code word. Square blocks each enclosed in a bold-line frame each represent a symbol (or a byte) of the error correction code word $W_0$.

That is to say, as shown in FIG. 8, the symbols of the error correction code word $W_0$ enclosed in bold-line frames are composed of high-order bytes and low-order bytes the number of which is equal to the number of high-order bytes. To put it more concretely, the error correction code word $W_0$ is stored in the buffer memory 42 sequentially at positions $S_{0,0}$, $S_{1,1}$, $S_{2,0}$, $S_{3,1}$ and so on alternately with positions $S_{0,1}$, $S_{1,0}$, $S_{2,1}$, $S_{3,0}$ and so on which are allocated to a error correction code word $W_1$. Thus, the symbols of the error correction code word $W_0$ are composed of high-order bytes and low-order bytes the number of which is equal to the number of high-order bytes.

Let all symbols pertaining to an error correction code word $W_0$ be represented by the integer 0, all symbols pertaining to an error correction code word $W_1$ be represented by the integer 1, all symbols pertaining to an error correction code word $W_2$ be represented by the integer 2 whereas all symbols pertaining to an error correction code word $W_3$ be represented by the integer 3 as shown in a diagram of FIG. 9. In this case, the integers 0 and 1 on the first and second columns are stored alternately whereas the integers 2 and 3 on the third and fourth columns are stored alternately. That is to say, the interleaver 22 carries out such an interleaving process that, in an operation to store a specific one of four symbols each represented by an integer i (where $0 \leq i < 4$) indicating an error correction code word containing the specific symbol in a square block of the buffer memory 42, the address controller 41 controls the write address of the specific symbol so that the specific symbol is stored in a square block allocated to a symbol pertaining to another error correction code word as a symbol other than the specific symbol as shown in a diagram of FIG. 9. As a result, the interleaving process carried out by the interleaver 22 produces results shown in the diagram of FIG. 9.

Figure 10:
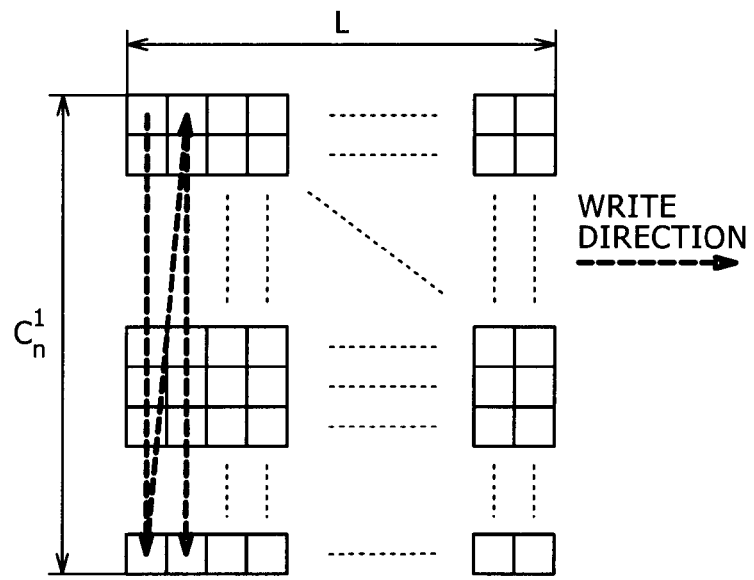
FIG. 10 is a diagram showing buffer-memory contents to be referred to in description of an interleaving process carried out by changing read addresses.

As described above, the address controller 41 fixes the read addresses but changes the write addresses. It is to be noted that the address controller 41 may also fixes the write addresses but changes the read addresses. In this case, the write address is updated in directions each indicated by a dashed-line arrow in a diagram of FIG. 10 while the address controller 41 is changing the read address.

Let notation $R_i$ (where $0 \leq i < C_n^1$) denote a row on the buffer memory 42. Thus, if the interleaving method implemented by fixing the write addresses and changing the read addresses is adopted, in an operation to read out data from $C_n^1$ rows of the buffer memory 42, the address controller 41 changes the read addresses so that equations referred to as Eq. (2) given below are satisfied.

$$R_{2k} = \{S_{2k,0}, S_{2k,1}, S_{2k,2}, \ldots, S_{2k,i}, \ldots, S_{2k,L-1}\},$$

$$R_{2k+1} = \{S_{2k+1,1}, S_{2k+1,0}, S_{2k+1,2}, \ldots, \\ S_{2k+1, i+((i+) \bmod 2)-(i \bmod 2)}, \ldots, S_{2k+1,L-1}, \\ S_{2k+1,L-2}\} \quad (2)$$

In Eq. (2), subscript k has a value in the range $0 \leq k < C_n^1/2$ whereas the row number i used as a subscript has a value in the range $0 \leq i < L$.

As described above, even if the interleaving method implemented by fixing the write addresses and changing the read addresses is adopted, the interleaving process can be carried out in the same way as the interleaving method implemented by fixing the read addresses and changing the write addresses.

As described above, if the address controller 41 employed in the interleaver 22 fixes the read addresses but changes the write addresses, the write addresses are modified so that the equations referred to as Eq. (1) are satisfied. If the address controller 41 fixes the write addresses but changes the read addresses, on the other hand, the read addresses are modified so that the equations referred to as Eq. (2) are satisfied.

Thus, in the error correction code word, errors can be included uniformly in a high-order byte serving as a symbol having a low bit error rate and a low-order byte serving as a symbol having a high bit error rate. Accordingly, even if errors caused by a method of configuring an RLL code are generated at error positions not uniformly distributed in the information word of the RLL code obtained as a result of a decoding process, the errors generated in the decoding process of the RLL code are distributed uniformly in the error correction code word. As a result, it is possible to reduce the probability of generation of errors in the error correction code word as errors exceeding the error correction capability and, thus, reduce the rate of errors undetected in the error correction process.

Figure 1:
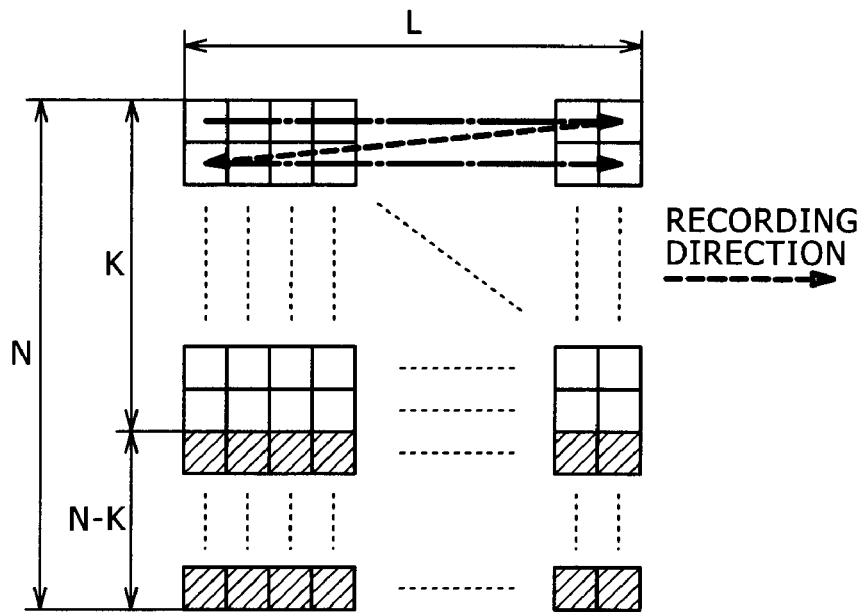
FIG. 1 is an explanatory diagram to be referred to in description of arrangement of bytes in an interleaving process of L stages.
Figure 2:
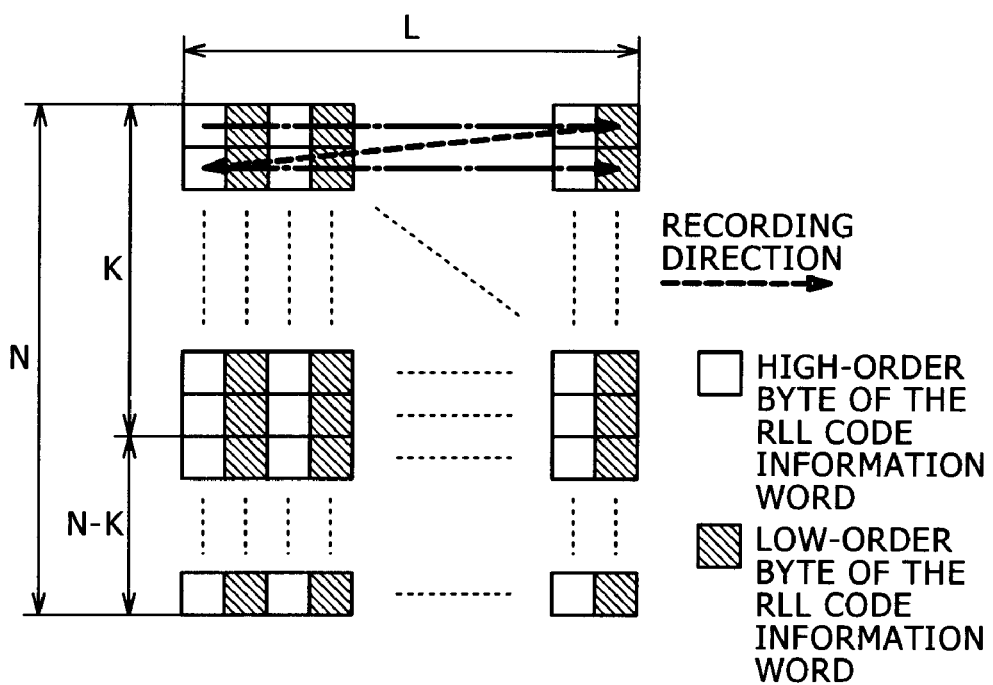
FIG. 2 is a diagram showing high-order bytes each included in the RLL code word as a byte composed of 8 high-order bits and low-order bytes each included in the RLL code word as a byte composed of 8 low-order bits in an interleaver of C2 L stages.
Figure 4:
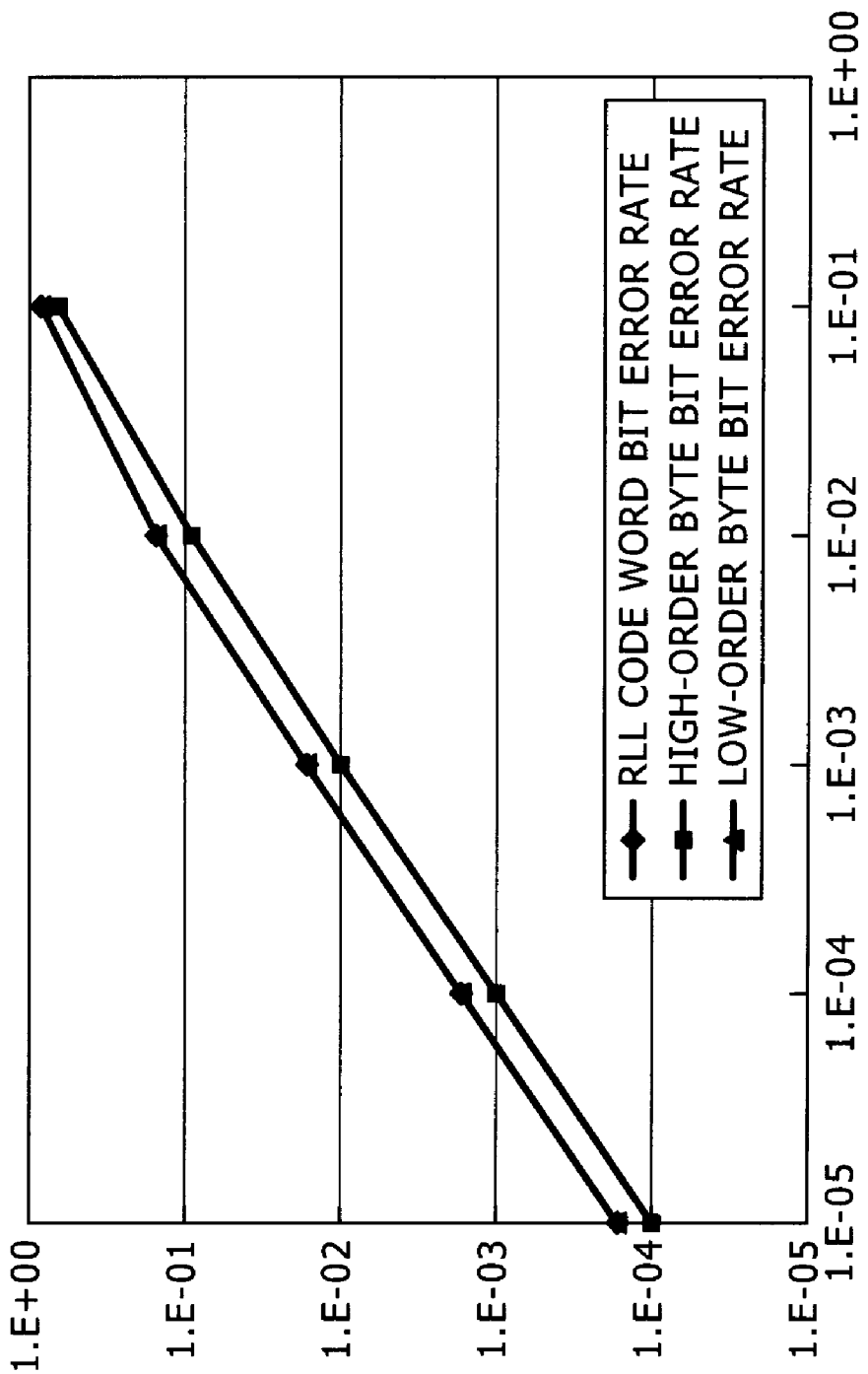
FIG. 4 is a diagram showing graphs each representing bit error rates in high-order and low-order bytes of an information word obtained as a result of an RLL decoding process.
Figure 11:
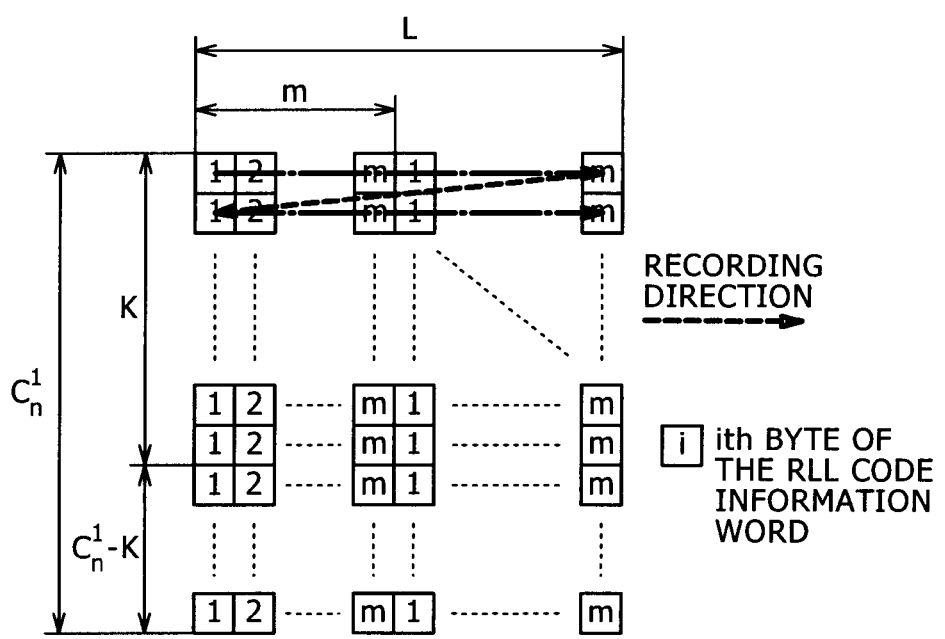
FIG. 11 is a diagram showing typical contents of a buffer memory for a case in which each RLL code word is composed of m symbols.

By the way, let us consider a case in which an RLL code word is composed of m symbols and the symbol count m is a divisor of the stage count L representing the number of interleaving stages. In this case, a result of an interleaving process adopting the interleaving method explained earlier by referring to the diagram of FIG. 1 is shown in a diagram of FIG. 11. That is to say, in the symbol matrix shown in the diagram of FIG. 11, the first row is occupied by symbols 1, 2, ... to m pertaining to an RLL code word and symbols 1, 2, ... to m pertaining to another RLL code word. By the same token, the second row is occupied by symbols 1, 2, ... to m pertaining to an RLL code word and symbols 1, 2, ... to m pertaining to another RLL code word. In the same way, the kth row is occupied by symbols 1, 2, ... to m pertaining to an RLL code word and symbols 1, 2, ... to m pertaining to another RLL code word. That is to say, each symbol included in every error correction code word becomes RLL code word symbols placed at the same byte position in RLL code words.

In this case, the address controller 41 employed in the interleaver 22 adopts an interleaving method of changing write addresses so that equations referred to as Eq. (3) given below are satisfied. By adoption of this interleaving method, symbols included in error correction code words are apportioned to RLL code words by properly changing the write addresses of the symbols so that each symbol included in a word of an RLL code as a symbol placed at a certain byte position address in the word of the RLL code corresponds to $C_n^1$ symbols distributed uniformly among $C_n^1$ error correction code words.

$$W_{mk} = \begin{matrix} \{S_{0,mk}, S_{1,mk+1}, S_{2,mk+2}, \ldots, \\ S_{i,mk+(i \bmod m)}, \ldots, S_{C_n^1-1, mk+(m-1)}\}. \end{matrix} \quad (3)$$

$$W_{mk+1} = \begin{matrix} \{S_{0,mk+1}, S_{1,mk+2}, S_{2,mk+3}, \ldots, \\ S_{i,mk+((i+1) \bmod m)}, \ldots, S_{C_n^1-1, 0}\}, \end{matrix}$$

$$\vdots$$

$$W_{mk+j} = \left\{ \begin{matrix} S_{0,mk+(j \bmod m)}, S_{1,mk+((j+1) \bmod m)}, \\ S_{2,mk+((j+2) \bmod m)}, \ldots, S_{i,mk+((j+i) \bmod m)}, \ldots, \\ S_{C_n^1-1, mk+((m+j-1) \bmod m)} \end{matrix} \right\},$$

$$\vdots$$

$$W_{mk+(m-1)} = \begin{matrix} \{S_{0,mk+(m-1)}, S_{1,mk}, S_{2,mk+1}, \ldots, \\ S_{i,mk+(i+(m-1) \bmod m)}, \ldots, S_{C_n^1-1, mk+(m-2)}\} \end{matrix}$$

In Eq. (3), subscript k has a value in the range $0 \leq k < L/m$ whereas the integer j used as a subscript has a value in the range $0 \leq j < m$.

A typical example of a result of the interleaving process described above is explained by referring to a diagram of FIG. 12. In the typical example shown in the diagram of FIG. 12, an RLL code word is composed of four symbols (that is, m=4), the number of symbols in an error correction code word is 16 (that is, $C_n^1$=16) and the number of interleaving stages is four (that is, L=4). The diagram of FIG. 12 shows a typical result of the interleaving process according to Eq. (3). In the diagram of FIG. 12, all symbols pertaining to an error correction code word $W_0$ are represented by the integer 0, all symbols pertaining to an error correction code word $W_1$ are represented by the integer 1, all symbols pertaining to an error correction code word $W_2$ are represented by the integer 2 whereas all symbols pertaining to an error correction code word $W_3$ are represented by the integer 3. In this case, each of the first to fourth columns is occupied by a predetermined pattern based on Eq. (3) as a pattern of the integers 0 to 3. That is to say, the interleaver 22 carries out such an interleaving process that, in an operation to store a specific one of four symbols each represented by an integer i (where $0 \leq i < 4$) indicating an error correction code word containing the specific symbol in a square block of the buffer memory 42, the address controller 41 controls the write address of the specific symbol so that the specific symbol is stored in a square block allocated to a symbol pertaining to another error correction code word as a symbol other than the specific symbol as shown in a diagram of FIG. 12. For example, a symbol of 0 on the second row is stored in a square block on the second column whereas a symbol of 1 on the second row is stored in a square block on the third column. By the same token, a symbol of 2 on the second row is stored in a square block on the fourth column whereas a symbol of 3 on the second row is stored in a square block on the first column. As a result, the interleaving process carried out by the interleaver 22 produces results shown in the diagram of FIG. 12.

Figure 13:
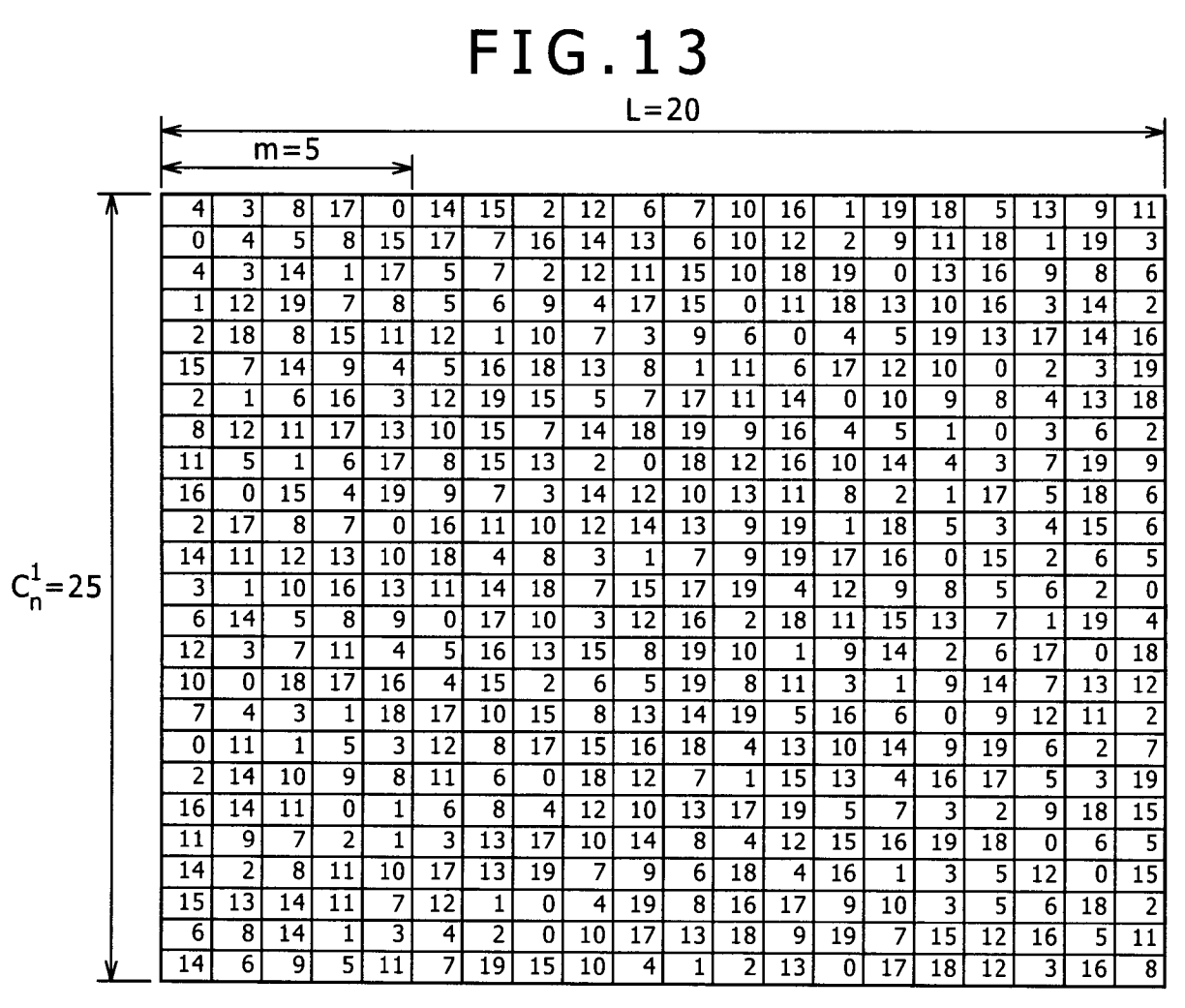

In another typical example shown in the diagram of FIG. 13, as a result of an interleaving process according to FIG. 13, an RLL code word is composed of five symbols (that is, m=5), the number of symbols in an error correction code word is 25 (that is, $C_n^1$=25) and the number of interleaving stages is 20 (that is, L=20).

In the diagram of FIG. 13, a square block is a symbol and an integer i (where $0 \leq i < 20$) in a block represents all symbols pertaining to an error correction code word $W_i$ which is one of 20 error correction code words $W_0$ to $W_{19}$. That is to say, the interleaver 22 carries out such an interleaving process that, in an operation to store a specific one of twenty symbols each represented by an integer i (where $0 \leq i < 20$) indicating an error correction code word containing the specific symbol in a square block of the buffer memory 42, the address controller 41 controls the write address of the specific symbol so that the specific symbol is stored in a square block allocated to a symbol pertaining to another error correction code word as a symbol other than the specific symbol as shown in a diagram of FIG. 13. As a result, the interleaving process carried out by the interleaver 22 produces results shown in the diagram of FIG. 13.

That is to say, also in this case, the address controller 41 applies Eq. (3) given above to an interleaving method. In other words, Eq. (3) is an equation serving as the basis of the interleaving method provided for a case in which the RLL code word is composed of m symbols and the symbol count m is a divisor of the stage count L representing the number of interleaving stages. In this case, however, data stored in the buffer memory 42 as a result of an interleaving process adopting an interleaving method based on Eq. (3) is subjected to processing including steps (a) and (b) described as follows.

(a): Interchange two symbols $S_{i,j'm+k}$ and $S_{i,j'n+k}$ (where $0 \leq j < L/m$) on the ith row with each other (b): Interchanges symbols on any two rows For m=5 and L=20 taken as an example, the address controller 41 interchanges two symbols $S_{1,3}$ and $S_{1,8}$ on the same row with each other.

Then, the address controller 41 controls write addresses in order to carry out each of the steps (a) and (b) a plurality of times in an interleaving process which results in a configuration like one shown in the diagram of FIG. 13.

As described above, in accordance with the interleaving method according to the embodiment, symbols of error correction code words are rearranged to result in a number of conceivable patterns. Each of the patterns described above is no more than a typical pattern. It is needless to say that symbols of error correction code words can be rearranged to result in other patterns which each include high-order bytes and low-order bytes the number of which is equal to the number of high-order bytes. As described before, a high-order byte represents a symbol having a low bit error rate whereas a low-order byte represents a symbol having a high bit error rate.

It is to be noted that even if Eq. (3) is applied by adopting the interleaving principle explained before by referring to the diagram of FIG. 10, instead of fixing read addresses, write addresses can be fixed while read addresses are changed.

Figure 14:
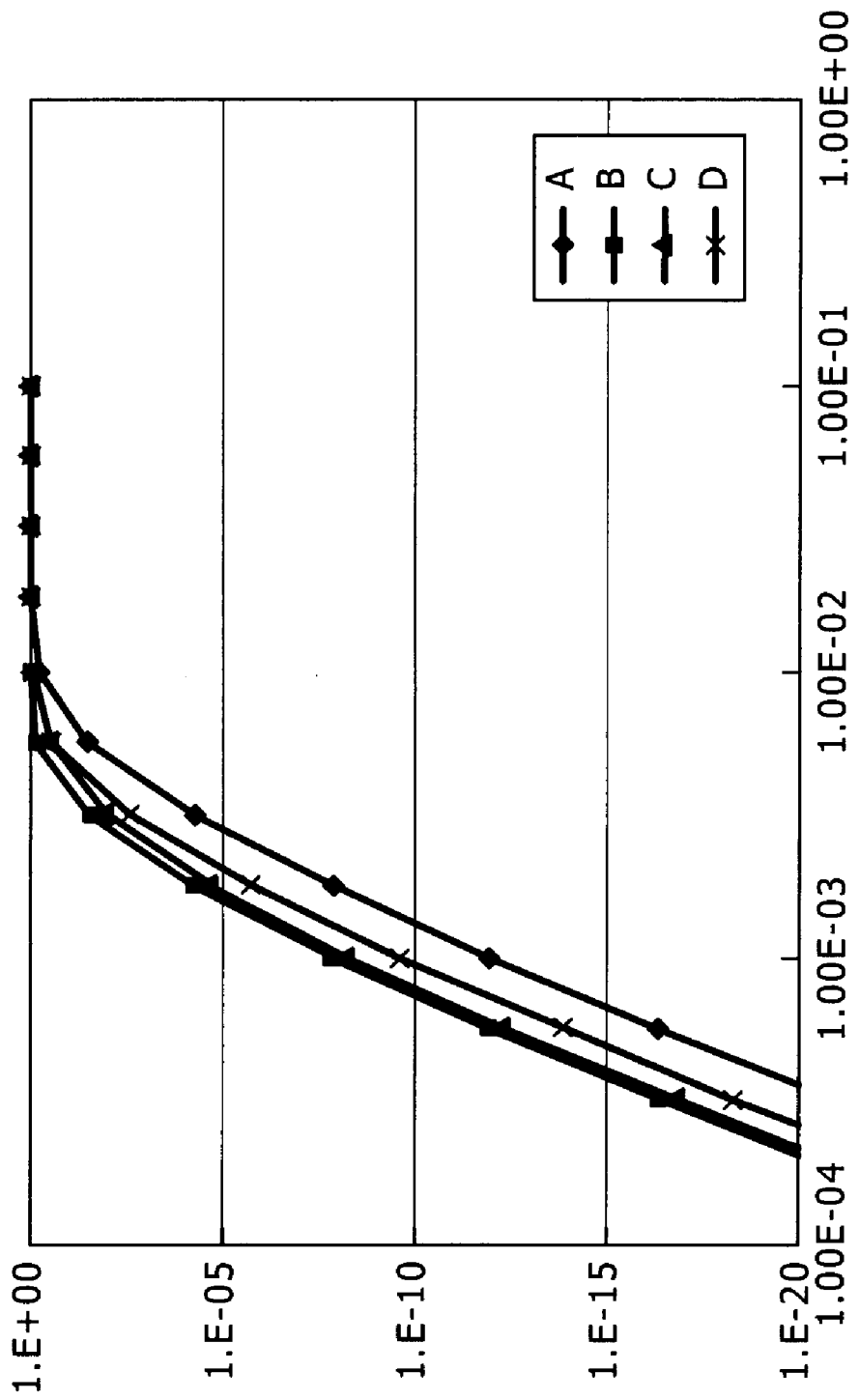
FIG. 14 is a diagram showing graphs each representing a relation between the bit error rate of random errors deliberately given to an RLL code word supplied as an input to an RLL decoder and the bit error rate of an error correction code word.

FIG. 14 is a diagram showing graphs each representing a relation between the bit error rate of random errors deliberately given to an RLL code word supplied as an input to the RLL decoder 30, which functions as a decoder for decoding RLL code words, as an RLL code originally having no errors and the bit error rate of the error correction code word 1. The RLL code is an RLL code with $r_k$=16 and $r_n$=17 whereas the error correction code word 1 is an RS code with $C_n^1$=228 and $C_k^1$=192. The graphs represent bit error rate relations for the interleaving method in related art and the interleaving method provided by the embodiment of the present invention.

In the diagram of FIG. 14, the horizontal axis represents the bit error rate of random errors deliberately given to an RLL code word supplied as an input to the RLL decoder 30. The direction from the left-hand side of the horizontal axis to the right-hand side of the horizontal axis is a direction in which the bit error rate worsens. On the other hand, the vertical axis represents the bit error rate of the error correction code word 1. The direction from the lower side of the vertical axis to the upper side of the vertical axis is a direction in which the bit error rate worsens.

In the diagram of FIG. 14, each of the graph shown as a line connecting rhombic points A and the graph shown as a line connecting rectangular points B represents a bit error rate relation for the interleaving method in related art. To be more specific, the graph shown as a line connecting rhombic points A represents a bit error rate relation for the error correction code word 1 including only high-order bytes whereas the graph shown as a line connecting rectangular points B represents a bit error rate relation for the error correction code word 1 including only low-order bytes. As described earlier, in comparison with the error correction code word 1 represented by the graph shown as a line connecting rhombic points A as an error correction code word 1 including only high-order bytes, in the case of the error correction code word 1 represented by the graph shown as a line connecting rectangular points B as an error correction code word 1 including only low-order bytes, the frequency of generating a code having a power exceeding the power of an error correction code is high so that the post-decoding bit error rate of the actual output of the RLL decoder 30 is higher than a post-decoding bit error rate which is inferred from pre-decoding byte errors.

The graph shown as a line connecting triangular points C represents averages of bit error rates each represented by the graph shown as a line connecting rhombic points A as a bit error rate of the error correction code word 1 including only high-order bytes and bit error rates each represented by the graph shown as a line connecting rectangular points B as a bit error rate of the error correction code word 1 including only low-order bytes. Since the bit error rate of the error correction code word 1 including only low-order bytes is much higher than the bit error rate of the error correction code word 1 including only high-order bytes, the graph shown as a line connecting triangular points C represents bit error rates almost equal to the bit error rates each represented by the graph shown as a line connecting rectangular points B as a bit error rate of the error correction code word 1 including only low-order bytes.

The graph shown as a line connecting cross marks D represents the bit error rate of the error correction code word 1 for the interleaving method provided by the present embodiment. As is obvious from the diagram of FIG. 14, for input bit error rates not greater than $10^{-3}$, the output bit error rate can be suppressed to about 1/100 of the output bit error rate represented by the graph shown as a line connecting triangular points C as the average output bit error rate for the interleaving method in related art.

Accordingly, even if errors caused by a method of configuring an RLL code are generated at error positions not uniformly distributed in the information word of the RLL code obtained as a result of a decoding process, by adopting the interleaving method provided by the present embodiment as described above, the errors generated in the decoding process of the RLL code are distributed uniformly in the error correction code word. As a result, it is possible to reduce the probability of generation of errors in the error correction code word as errors exceeding the error correction capability and, thus, reduce the rate of errors undetected in the error correction process.

The interleaving method provided by the present embodiment can be summarized as follows. In the recording/reproduction apparatus 11 for carrying out an encoding process by combining two different code words, i.e., an RLL code word and an error correction code word, with an interleaving technique, the interleaver 22 carries out an interleaving process to interleave (k×m) aforementioned error correction code words each having a length of n symbols in the case of the RLL code word composed of an information word with a length of m symbols where a symbol is a unit composing the error correction code word, notation m denotes an integer equal to or greater than 2 (that is, m≧2) and notation k denotes an integer equal to or greater than 1 (that is, k≧1), and the RLL encoder 23 receives the result of the interleaving process. At that time, if an address i (where notation is an integer satisfying relations 0≦i<k×m) is assigned to each symbol of the k×m error correction code words and $x_{ij}$ is taken as a notation denoting the number of symbols included in n symbols of a jth (where notation j is an integer satisfying relations 0≦j<m) code word of m error correction code words to serve as symbols corresponding to the address i of an information word of an RLL code, for any j, the interleaver 22 can be said to interleave a series inside an information word of the RLL code word so that the following relations are satisfied:

$$\sum_i x_{ij} = n \text{ and } x_{ij} > 0.$$

In addition, if the code word length n is a multiple of the information word length m and ε is taken as a notation representing the ratio of n to m (that is, ε=n/m), the interleaver 22 can be said to interleave the series so that the following relations are satisfied:

$$\sum_i x_{ij} = n \text{ and } x_{ij} = \varepsilon.$$

Figure 15:
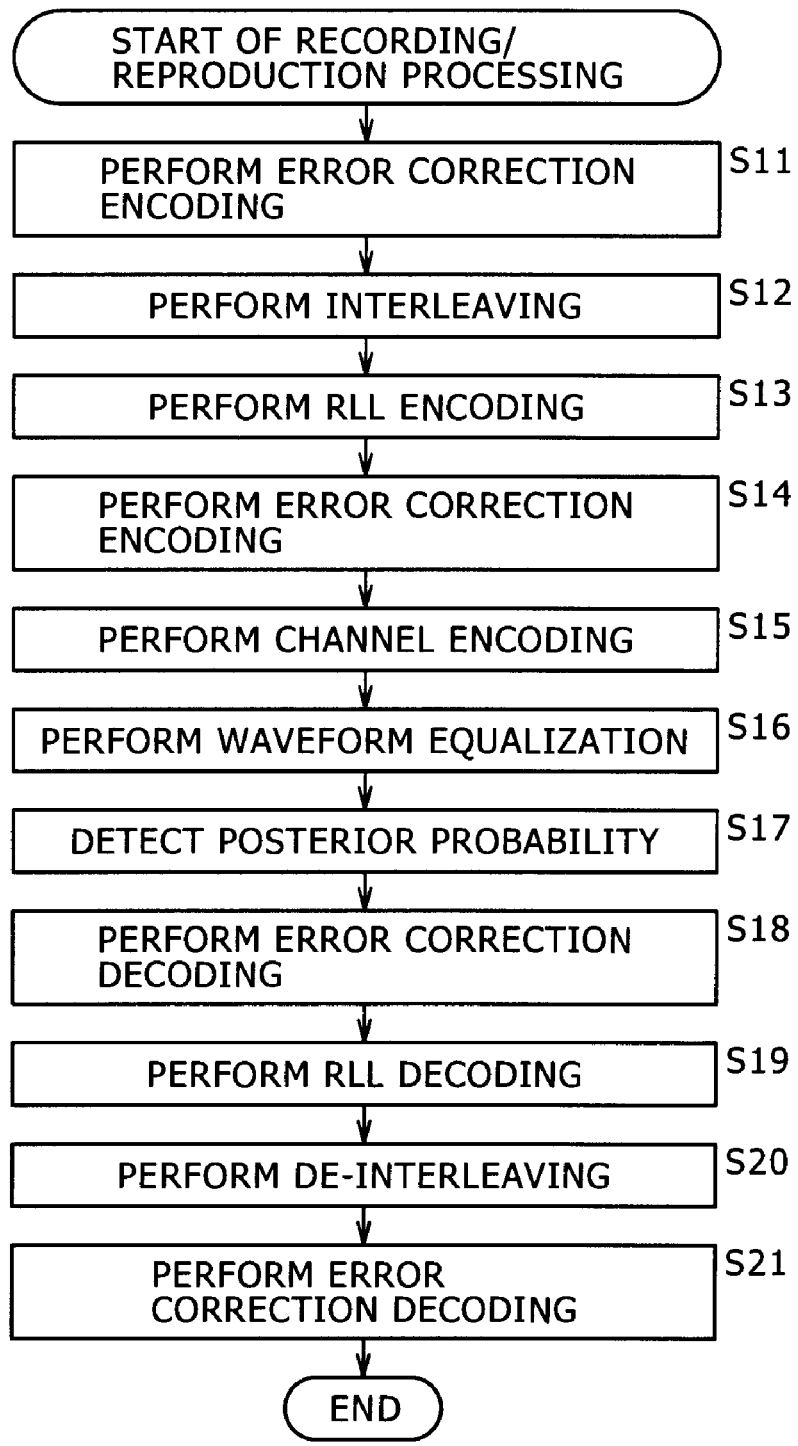
FIG. 15 shows an explanatory flowchart representing recording/reproduction processing.

Next, the recording and reproduction processing carried out by the recording/reproduction apparatus 11 is explained by referring to a flowchart shown in FIG. 15.

At the first step S11 of the flowchart, the error correction encoder 21 encodes input data with a length of $C_k^1$ symbols into an error correction code word 1 with a length of $C_n^1$ symbols and supplies the error correction code word 1 to the interleaver 22.

Then, at the next step S12, the interleaver 22 carries out an interleaving process to interleave the error correction code words 1 received from the error correction encoder 21. The number of error correction code words 1 subjected to the interleaving process is determined in advance. Then, the interleaver 22 supplies the result of the interleaving process to the RLL encoder 23 in units which each are composed of $r_k$ bits.

To put it more concretely, the address controller 41 employed in the interleaver 22 carries out the interleaving process to rearrange the error correction code words 1 received from the error correction encoder 21 by controlling read or write addresses at which the error correction code words 1 are to be read out or stored into the buffer memory 42. This interleaving method is the method explained earlier by referring to the diagram of FIG. 9, 12 or 13. As a result of the execution of the interleaving process, high-order bytes each occupied by a symbol with a low bit error rate in the error correction code words 1 and low-order bytes each occupied by a symbol with a high bit error rate in the error correction code words 1 are distributed uniformly in resulting RLL code words.

Then, at the next step S13, the RLL encoder 23 carries out an RLL encoding process to encode the input received from the interleaver 22 as an input having a length of $r_k$ bits into an RLL code word which has a length of $r_n$ bits. The RLL encoder 23 then supplies a result of the encoding process to the error correction encoder 24 in units which are each an RLL code word having a length of $r_n$ bits.

Then, at the next step S14, the error correction encoder 24 receives the RLL code word, which is output by the RLL encoder 23, as an input. The error correction encoder 24 then carries out an error correction encoding process to encode this input having a length of $c_k^2$ bits into a code word having a length of $c_n^2$ bits. As described previously, the code word having a length of $c_n^2$ bits is referred to as an error correction code word 2. The error correction code word 2 obtained as a result of the encoding process carried out by the error correction encoder 24 is finally supplied to the channel encoder 25.

Then, at the next step S15, the channel encoder 25 carries out a channel encoding process to encode the error correction code word 2 received from the error correction encoder 24 and stores the result of the process onto the recording section 26.

The processing described above is recording processing carried out by the recording/reproduction apparatus 11 to store input data supplied to the recording/reproduction apparatus 11 in the recording section 26.

In an operation to reproduce data stored in the recording section 26 from the recording section 26, on the other hand, the reproduction waveform of data read out from the recording section 26 is supplied to an analog equalizer and an AND (analog to digital) converter, which are not shown in the block diagram of FIG. 5, in order to generate a received value for each unit time. The received value is then supplied to the equalizer 27.

Then, at the next step S16, the equalizer 27 carries out a waveform equalization process on the received value supplied by the A/D converter and supplies the equalized value obtained as a result of the waveform equalization process for each unit time to the posterior probability detector 28.

Then, at the next step S17, the posterior probability detector 28 sequentially computes a posterior probability for every unit time from equalized values each received from the equalizer 27 for every unit time as an equalized value resulting from the waveform equalization process carried out by the equalizer 27 on a received value. The posterior probability detector 28 then supplies the computed posterior probability to the error correction decoder 29.

Then, at the next step S18, the error correction decoder 29 receives the computed posterior probabilities for $c_n^2$ unit times from the posterior probability detector 28. The error correction decoder 29 then carries out a decoding process to decode the error correction code word 2 by making use of the computed posterior probabilities and supplies $c_k^2$ bits obtained as a result of the decoding process to the RLL decoder 30 for every unit which is composed of $r_n$ bits.

Then, at the next step S19, the RLL decoder 30 carries out a decoding process to decode an RLL code word received from the error correction decoder 29 and outputs the result of the decoding process to the de-interleaver 31 for every unit which is composed of $r_k$ bits.

Then, at the next step S20, the de-interleaver 31 carries out a de-interleaving process determined in advance on the output generated by the RLL decoder 30 and outputs the result of the process to the error correction decoder 32. The de-interleaving process is a process opposite to the interleaving process carried out by the interleaver 22.

Then, at the next step S21, the error correction decoder 32 carries out a decoding process to decode the error correction code word 1 received from the de-interleaver 31 as a word having a length of $C_n^1$ symbols into output data having a length of $C_k^1$ symbols. The error correction decoder 32 then outputs this output data obtained as a result of the decoding process. At this step S21, the reproduction processing carried out by the recording/reproduction apparatus 11 as processing started with the step S16 is ended.

As described above, the processing composed of the steps S11 to S15 is the recording processing carried out by the recording/reproduction apparatus 11 whereas the processing composed of the steps S16 to S21 is the reproduction processing carried out by the recording/reproduction apparatus 11.

Figure 16:
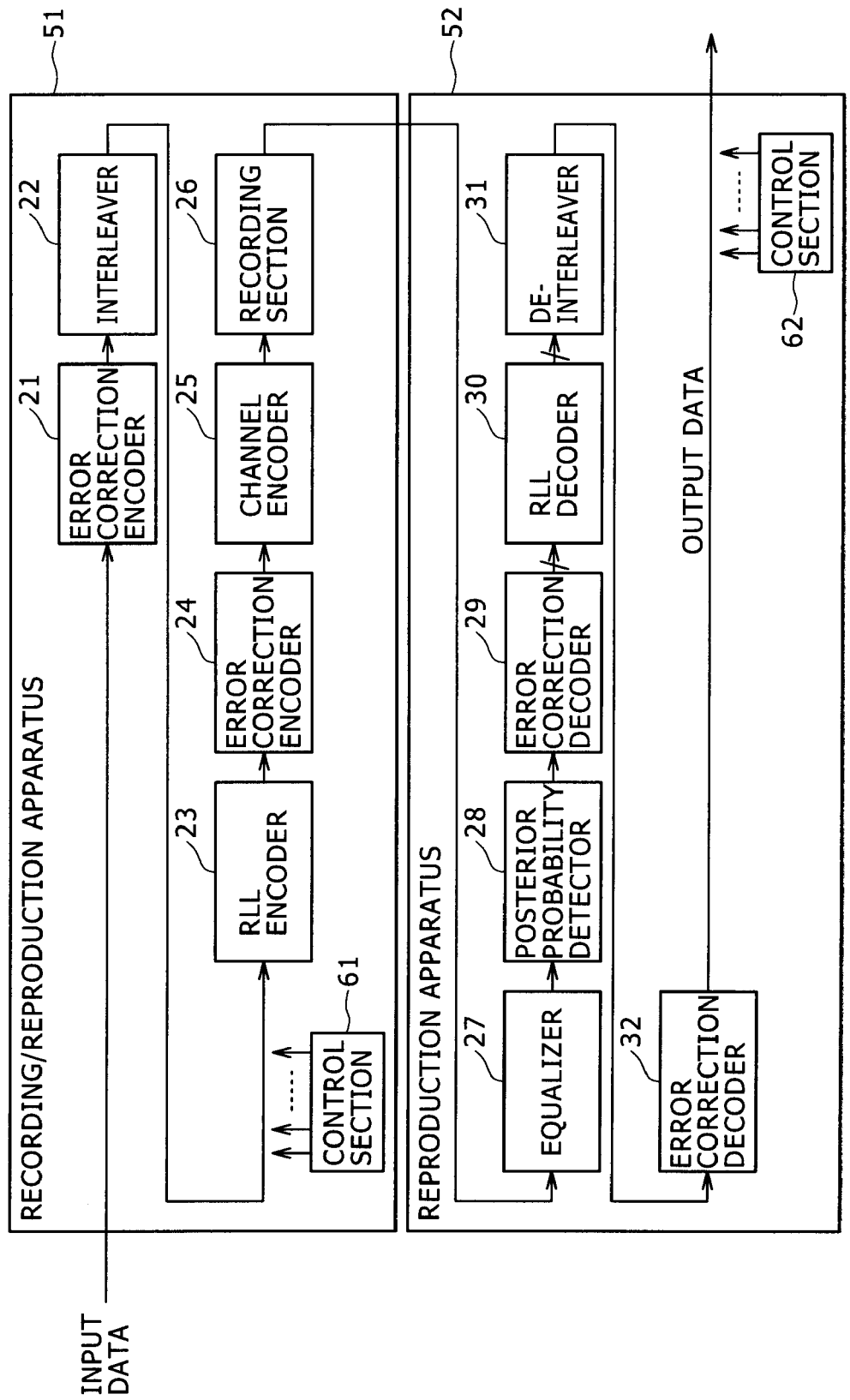
FIG. 16 is a block diagram showing a system employing recording and reproduction apparatus according to the embodiment of the present invention.

It is to be noted that the recording/reproduction apparatus 11 shown in the block diagram of FIG. 5 to serve as an apparatus according to the embodiment can be perceived as a system employing a recording apparatus and a reproduction apparatus. As a matter of fact, FIG. 16 is a block diagram showing the configuration of the system employing a recording apparatus 51 and a reproduction apparatus 52. In the block diagram of FIG. 16, configuration elements identical with their respective counterparts employed in the recording/reproduction apparatus 11 shown in the block diagram of FIG. 5 are denoted by the same reference numerals as the counterparts, and explanation of the identical configuration elements is not repeated in order to avoid duplications of descriptions.

That is to say, in system shown in the block diagram of FIG. 16, the error correction encoder 21 to the error correction decoder 32 which compose the recording/reproduction apparatus 11 are split into the error correction encoder 21 to the recording section 26 which compose the recording apparatus 51 and the equalizer 27 to the error correction decoder 32 which compose the reproduction apparatus 52. In addition, the control section 33 is split into a control section 61 included in the recording apparatus 51 and a control section 62 employed in the reproduction apparatus 52. Thus, in this system, the recording apparatus 51 carries out the steps S11 to S15 of the flowchart shown in FIG. 15 in order to execute the recording processing whereas the reproduction apparatus 52 carries out the steps S16 to S21 of the same flowchart in order to execute the reproduction processing.

In addition, the embodiment is exemplified by taking the recording/reproduction apparatus 11 as a typical example. However, the present invention can also be applied to any other apparatus for carrying out an encoding process by combining two types of code word, i.e., an RLL code word and an error correction code word, with an interleaving method. To put it more concretely, for example, the present invention can be applied to a receiving/transmitting apparatus for carrying out an encoding process by combining error correction code words with an interleaving method in order to efficiently correct errors generated on a transmission line. In this application, the receiving/transmitting apparatus can be perceived as a system which employs a transmitting apparatus corresponding to the recording apparatus 51 and a receiving apparatus corresponding to the reproduction apparatus 52.

On top of that, the encoding method is explained as a method applied to the RLL code. However, applications of the present invention are by no means limited to the RLL code. For example, the present invention can also be applied to codes subjected to encoding processes adopting a TMDS method.

The series of processes described previously can be carried out by hardware and/or execution of software. If the series of processes described above is carried out by execution of software, programs composing the software can be installed into a computer embedded in dedicated hardware, a general-purpose personal computer or the like from typically a program provider on a network or a removable recording medium. In this case, the computer or the personal computer serves as the recording/reproduction apparatus 11 described above. A general-purpose personal computer is a personal computer, which can be made capable of carrying out a variety of functions by installing a variety of programs into the personal computer.

FIG. 17 is a block diagram showing the configuration of the general-purpose personal computer for executing the programs in order to carry out the series of processes described previously in its capacity as the recording/reproduction apparatus 11. In the general-purpose personal computer shown in the block diagram of FIG. 17, a CPU (Central Processing Unit) 111 carries out various kinds of processing by execution of programs stored in a ROM (Read Only Memory) 112 or programs loaded from a recording section 118 into a RAM (Random Access Memory) 113. The RAM 113 is also used for properly storing various kinds of information such as data required in execution of the processing. The CPU 111, the ROM 112 and the RAM 113 are connected to each other by a bus 114 also connected to an input/output interface 115 to which the recording section 118 is wired.

Thus, the CPU 111 is connected to the input/output interface 115 by the bus 114. The input/output interface 115 is connected to an input section 116, an output section 117, the recording section 118 as described above, a communication section 119 and a drive 120. The input section 116 includes a keyboard, a mouse and a microphone whereas the output section 117 includes a display unit and a speaker. The CPU 111 carries out various kinds of processing in accordance with commands entered by the user via the input section 116. Then, the CPU 111 outputs results of the processing to the output section 117.

The recording section 118 connected to the input/output interface 115 includes a hard disk. The recording section 118 is used for storing a variety of programs to be loaded into the RAM 113 for execution by the CPU 111 and storing various kinds of data. The communication section 119 is a unit for carrying out communication processing with other apparatus through a network not shown in the figure. Typical examples of the network are the Internet and a LAN (Local Area Network).

The programs composing the software can be downloaded from a program provider by way of the network and the communication section 119 and installed in the recording section 118 as will be described more later.

As described above, the input/output interface 115 is also connected to a drive 120 on which a removable recording medium 121 is mounted to be driven by the drive 120. The removable recording medium 121 can be a magnetic disk, an optical disk, a magneto-optical disk or a semiconductor memory. Instead of installing a computer program to be executed by the CPU 111 from a program provider, as described above, the computer program can be installed from the removable recording medium 121 into the recording section 118 as needed.

The aforementioned recording medium for recording programs to be installed into in the recording section 118 employed in a computer or a general-purpose personal computer as programs to be executed by the computer or the general-purpose personal computer respectively is the removable recording medium 121 provided to the user as a package medium separately from the main unit of the computer serving as the recording/reproduction apparatus 11 as shown in FIG. 17. Examples of the removable recording mediums include the magnetic disk such as a flexible disk, the optical disk such as a CD-ROM (Compact Disk-Read Only Memory) or a DVD (Digital Versatile Disk), the magneto-optical disk such as an MD (Mini Disk) as well as the semiconductor memory. As an alternative, the programs can also be stored in advance temporarily or permanently in the ROM 112 or the recording section 118 such as a hard disk. In addition, instead of installing the programs composing the software from the removable recording mediums 121 into the recording section 118, if necessary, the programs can also be downloaded from a program provider to the communication section 119 through wire communication means including a network such as the Internet or a LAN or through radio communication means such as digital satellite broadcasting and, then, installed into the recording section 118. The communication section 119 includes a router and a modem, for example.

It is also worth noting that, in this specification, steps of a program stored in a recording medium can of course be carried out in a pre-prescribed order along the time axis. However, the steps do not have to be carried out in a pre-prescribed order along the time axis. The steps can also be carried out concurrently or individually.

It is also to be noted that the technical term 'system' used in this specification implies the configuration of a confluence including a plurality of apparatus.

The present application contains subject matter related to that disclosed in Japanese Priority Patent Application JP 2008-139293 filed in the Japan Patent Office on May 28, 2008, the entire content of which is hereby incorporated by reference.

It should be understood by those skilled in the art that a variety of modifications, combinations, sub-combinations and alterations may occur, depending on design requirements and other factors insofar as they are within the scope of the appended claims or the equivalents thereof.

What is claimed is:

1. An encoding apparatus for carrying out an encoding process by combining two different code words, an RLL (Run Length Limited) code word and an error correction code word, with an interleaving technique, said encoding apparatus comprising:
   error correction encoding means for encoding input data into said error correction code word;
   interleaving means for interleaving (k×m) said error correction code words each having a length of n symbols in the case of said RLL code word composed of an information word with a length of m symbols where a symbol is a unit composing said error correction code word, notation m denotes an integer equal to or greater than 2, that is, m≧2, and notation k denotes an integer equal to or greater than 1, that is, k≧1; and
   RLL encoding means for encoding an information word of an RLL code word, which is generated by said interleaving means, into said RLL code word,
   wherein, if an address i, where notation i is an integer satisfying relations 0≦i<k×m, is assigned to each symbol of said k×m error correction code words and $x_{ij}$ is taken as a notation denoting the number of symbols included in n symbols of a jth, where notation j is an integer satisfying relations 0≦j<m, code word of m error correction code words to serve as symbols corresponding to said address i of an information word of an RLL code, for any j, said interleaving means interleaves a series inside an information word of said RLL code word so that the following relations are satisfied:

$$\sum_i x_{ij} = n \text{ and } x_{ij} > 0.$$

2. The encoding apparatus according to claim 1 wherein, if said code word length n is a multiple of said information word length m and E is taken as a notation representing a ratio of n to m, that is, ϵ=n/m, said interleaving means interleaves said series so that the following relations are satisfied:

$$\sum_i x_{ij} = n \text{ and } x_{ij} = \varepsilon.$$

3. An encoding method performed by an encoding apparatus for carrying out an encoding process by combining two different code words, an RLL (Run Length Limited) code word and an error correction code word, with an interleaving technique, said encoding method comprising the steps of:
   encoding input data into said error correction code word;
   interleaving (k×m) said error correction code words each having a length of n symbols in the case of said RLL code word composed of an information word with a length of m symbols where a symbol is a unit composing said error correction code word, notation m denotes an integer equal to or greater than 2, that is, m≧2, and notation k denotes an integer equal to or greater than 1, that is, k≧1; and
   encoding an information word of an RLL code word, which is generated at said interleaving step, into said RLL code word,
   whereby, if an address i, where notation i is an integer satisfying relations 0≦i<k×m, is assigned to each symbol of said k×m error correction code words and $x_{ij}$ is taken as a notation denoting the number of symbols included in n symbols of a jth, where notation j is an integer satisfying relations 0≦j<m, code word of m error correction code words to serve as symbols corresponding to said address i of an information word of an RLL code, for any j, a series inside an information word of said RLL code word is interleaved so that the following relations are satisfied:

$$\sum_i x_{ij} = n \text{ and } x_{ij} > 0.$$

4. A non-transitory program recording medium having an encoding program recorded therein to be computer-readable for controlling an apparatus for carrying out an encoding process by combining two different code words, an RLL (Run Length Limited) code word and an error correction code word, with an interleaving technique, said encoding program comprising the steps of:

encoding input data into said error correction code word;

interleaving (k×m) said error correction code words each having a length of n symbols in the case of said RLL code word composed of an information word with a length of m symbols where a symbol is a unit composing said error correction code word, notation m denotes an integer equal to or greater than 2, that is, m≧2, and notation k denotes an integer equal to or greater than 1, that is, k≧1; and encoding an information word of an RLL code word, which is generated at said interleaving step, into said RLL code word, wherein, if an address i, where notation i is an integer satisfying relations 0≦i<k×m, is assigned to each symbol of said k×m error correction code words and $x_{ij}$ is taken as a notation denoting the number of symbols included in n symbols of a jth, where notation j is an integer satisfying relations 0≦j<m, code word of m error correction code words to serve as symbols corresponding to said address i of an information word of an RLL code, for any j, a series inside an information word of said RLL code word is interleaved so that the following relations are satisfied:

$$\sum_i x_{ij} = n \text{ and } x_{ij} > 0.$$

5. An encoding apparatus for carrying out an encoding process by combining two different code words, an RLL (Run Length Limited) code word and an error correction code word, with an interleaving technique, said encoding apparatus comprising:

an error correction encoding section configured to encode input data into said error correction code word;

an interleaving section configured to interleave (k×m) said error correction code words each having a length of n symbols in the case of said RLL code word composed of an information word with a length of m symbols where a symbol is a unit composing said error correction code word, notation m denotes an integer equal to or greater than 2, that is, m≧2, and notation k denotes an integer equal to or greater than 1, that is, k≧1; and an RLL encoding section configured to encode an information word of an RLL code word, which is generated by said interleaving section, into said RLL code word, wherein, if an address i, where notation i is an integer satisfying relations 0≦i<k×m, is assigned to each symbol of said k×m error correction code words and $x_{ij}$ is taken as a notation denoting the number of symbols included in n symbols of a jth, where notation j is an integer satisfying relations 0≦j <m, code word of m error correction code words to serve as symbols corresponding to said address i of an information word of an RLL code, for any j, said interleaving section interleaves a series inside an information word of said RLL code word so that the following relations are satisfied:

$$\sum_i x_{ij} = n \text{ and } x_{ij} > 0.$$

* * * * *